United States Patent [19]
Sato et al.

[11] Patent Number: 5,410,210
[45] Date of Patent: Apr. 25, 1995

[54] PIEZOELECTRIC DEVICE AND PROCESS FOR PRODUCTION THEREOF

[75] Inventors: Takashi Sato; Kazuyuki Suzuki; Nobuhiro Moriyama; Kenichi Nakamura, all of Iwaki, Japan

[73] Assignee: Kureha Kagaku Kogyo Kabushiki Kaisha, Tokyo, Japan

[21] Appl. No.: 156,724

[22] Filed: Nov. 24, 1993

[51] Int. Cl.⁶ ............................................. H01L 41/08
[52] U.S. Cl. .................................. 310/363; 310/332; 310/800
[58] Field of Search ................. 310/363, 369, 800, 346

[56] References Cited

U.S. PATENT DOCUMENTS

| | | | |
|---|---|---|---|
| 1,958,014 | 5/1934 | Nicolson | 301/363 |
| 2,497,665 | 2/1950 | Gravley | 310/346 X |
| 3,470,394 | 9/1969 | Cook et al. | 310/363 X |
| 3,943,614 | 3/1976 | Yoshikawa et al. | 310/800 X |
| 4,400,642 | 8/1983 | Kiraly | 310/332 |
| 4,786,837 | 11/1988 | Kalnin et al. | 310/364 |
| 5,058,250 | 10/1991 | Turnbull | 310/800 X |
| 5,245,734 | 9/1993 | Issartel | 310/363 X |

FOREIGN PATENT DOCUMENTS

| | | | |
|---|---|---|---|
| 451788 | 10/1948 | Canada | 310/363 |
| 3221145 | 12/1982 | Germany | 310/800 |
| 3223801 | 12/1983 | Germany | 310/363 |
| 2042256 | 9/1980 | United Kingdom | 310/800 |

*Primary Examiner*—Mark O. Budd
*Attorney, Agent, or Firm*—Wenderoth, Lind & Ponack

[57] ABSTRACT

A sheet-form piezoelectric device having improved mechanical strengths as represented by an electrode peel strength while retaining flexibility and piezoelectric performances of a polymer-type piezoelectric device, is obtained by embedding a perforated sheet electrode into at least one surface layer of a polymer piezoelectric film treated with a solvent in advance. The sheet-form piezoelectric device may be wound or curved about a certain central axis to provide a tubular or curved piezoelectric device having wave-transmitting and/or -receiving characteristics suitable for wave-transmitting and/or -receiving devices, such as a hydrophone and microphone.

4 Claims, 7 Drawing Sheets

PIEZOELECTRIC DEVICE AND PROCESS FOR PRODUCTION THEREOF

FIELD OF THE INVENTION AND RELATED ART

The present invention relates to a polymer-type piezoelectric device having a perforated sheet electrode, a tubular or curved piezoelectric device utilizing the shapability of the polymer-type piezoelectric device, and a process for production of such piezoelectric devices.

A polymeric piezoelectric material as represented by a polarized vinylidene fluoride resin (hereinafter representatively called "PVDF") has many advantageous characteristics as follows compared with a ceramic piezoelectric material.

(1) It has a large flexibility, is readily formed into a film or in a large area or a long size, and thus can be formed into an arbitrary shape or form.

(2) It has a hydrostatic piezoelectric constant $d_h$ which is only identical to or even smaller than that of a ceramic piezoelectric material, but has a very large hydrostatic piezoelectric constant $g_h$ determined by $d_h/\epsilon$ because of a small dielectric constant $\epsilon$. Accordingly, it has an excellent sensitivity.

(3) It has a low density and a low elasticity, so that it has a specific acoustic impedance (=sonic propagation velocity×density) which is close to that of water or a living body. Accordingly, it can achieve an effective energy transmission accompanied with little reflection at a boundary between the device and water or a living body.

Because of such advantageous characteristics, a polymeric piezoelectric material has been proposed or commercialized generally as an electric-mechanic (acoustic) transducer or a pyroelectric transducer for a wide variety of uses, such as speaker, microphone, ultrasonic probe, hydrophone, vibration gauge, strain gauge, haemodynamometer, and bimorph fan.

In case of incorporating a polarized film or sheet or polymeric piezoelectric material (hereinafter inclusively referred to as "polymer piezoelectric film") into a device or transducer, the film is generally provided with an electrode on both surfaces thereof. As the electrode, there has been generally used a vapor-deposited electrode of a metal, such as copper or aluminum, or a foil electrode of such a metal applied with an adhesive, in view of a relatively low heat resistance of around 100° C. of a polymeric piezoelectric material inclusive of a piezoelectric characteristic provided by orientation-polarization, etc. Our research group has also proposed a thermally sprayed electrode of a relatively low-melting metal, such as zinc, thermally sprayed into a layer (EP-A 0528279). However, these electrodes respectively involve difficulties as described below.

First of all, a vapor-deposited electrode has only a small thickness on the order of 0.02-0.1 μm and has only a small adhesion with a polymer piezoelectric film, so that soldering for connection of a lead wire to the electrode is very difficult. Accordingly, for a polymer-type piezoelectric device equipped with vapor-deposited electrodes, it is generally required to provide a complicated electrode terminal structure for outputting electric signal from the polymer-type piezoelectric device.

In contrast thereto, a metal foil electrode may be formed as an electrode capable of soldering for lead wire connection by applying an ordinarily about 6-100 μm-thick metal foil onto a polymer piezoelectric film with an about 5-40 μm-thick layer of adhesive, such as polyester resin, urethane resin or epoxy resin. The metal foil electrode, however, can impair the flexibility, an important property of a polymer-type piezoelectric device, when provided onto both sides of a polymer piezoelectric film. Further, depending on the condition of use of the piezoelectric device, the device is liable to cause a difficulty with respect to durability, due to deterioration of the adhesive particularly on the side exposed to the atmosphere. Further, the hydrostatic piezoelectric constant $d_h$ can be lowered in some cases due to the presence of a non-piezoelectric adhesive layer.

On the other hand, a thermally sprayed electrode is preferable in many respects of adhesion with a polymeric piezoelectric material, solderability for lead wire connection, and flexibility of the resultant piezoelectric device. Because of the relatively low heat-resistance of a polymeric piezoelectric material, however, only a low-melting metal can be easily used for thermal spraying, so that the available electrode material is limited.

Generally, above-mentioned conventional electrodes are all formed on the entire surface of a polymeric piezoelectric material. Accordingly, a conventional piezoelectric device has to be entirely coated or sealed within a case for the purpose of electrical insulation or protection of the electrodes from the surrounding atmosphere in actual use.

As described above, an advantage of a polymer-type piezoelectric device compared with a ceramic-type piezoelectric device is that it is rich in flexibility. The flexibility, however, can be rather disadvantageous in some use. For example, a hydrophone used in a sonar towed by a towing means, such as a ship, for the purpose of detecting another ship, etc., involves a problem that it causes a deformation due to movement of the towing means transmitted via a towing rope or flexural stress by water stream, so that the objective signal given by a sonic pressure transmitted through water is superimposed with noise caused by the deformation. For such usage, a piezoelectric device is required to have a certain degree of rigidity capable of resisting a mechanical external force.

Further, in use as the above-mentioned hydrophone for a towed sonar or a wave-transmitting and/or -receiving device, such as a microphone, it is sometimes desirable that a piezoelectric device is formed in a tube in order to have an isotropic characteristic in its wave-transmitting or -receiving function. Further, it is sometimes desired that a piezoelectric device is formed in a curved shape in view of input/output characteristics of a wave-transmitting/receiving device or place of disposition of the device, apart from the isotropic characteristic. In order to form such a tubular piezoelectric device, it is conceivable 1) to wind a polymer piezoelectric film around a certain central axis to form a tube or cylinder and then form an electrode on both surface thereof, or 2) to form an electrode on at least one surface (corresponding to an inner surface of the resultant tube) of polymer piezoelectric film, form the film into a tube and then form an additional electrode on the outer surface of the tube, as desired. However, the method 1) involves a problem that it is extremely difficult to form a uniformly good electrode on the surfaces, particularly the inner surface, of the tubular polymer piezoelectric film. Further, if the method 2) is applied to a sheet-form piezoelectric device obtained by forming electrodes on booth surfaces of a polymer piezoelectric film, when the piezoelectric device is wound into a tube, the outer electrode is supplied with a tension stress and the inner electrode is supplied with a contraction stress. As a result, the outer electrode is liable to be cracked and the inner electrode is liable to be wrinkled in case where these electrodes are formed as foil electrodes or thermally sprayed electrodes, while it can depend on the curvature radius of the tube. Further, if the electrodes are formed as vapor-deposited electrodes having a relatively weak adhesion with the piezoelectric material, the electrodes are liable to be peeled or torn at the time of the winding or peeled at the time of lead wire connection. These difficulties are also encountered in the case of forming a curved piezoelectric device while it can depend on the required curvature radius.

SUMMARY OF THE INVENTION

A principal object of the present invention is to provide a piezoelectric device having an electrode structure integrally formed with a polymeric piezoelectric material without essentially impairing the excellent flexibility of a polymeric piezoelectric material.

Another object of the present invention is to provide a polymer-type tubular or curved piezoelectric device having a moderate rigidity.

A further object of the present invention is to provide a process for producing such a piezoelectric device.

As a result of our study with the objects, we have found that a device integrally formed by embedding a perforated sheet electrode at a surface layer of a polymer piezoelectric film shows a piezoelectric performance at a level identical to that of a device obtained by adhesion of a foil electrode in spite of the perforated structure adopted as the electrode in the present invention, shows an excellent electrode peel strength and is accompanied with a relatively small decrease in flexibility. Further, it has been also found that such an embedded structure of the perforated sheet electrode at the surface layer of a polymer piezoelectric film may be effectively formed by treating a surface of a polymer piezoelectric film with a good solvent and then pressing a perforated sheet electrode onto the surface for bonding.

Further, it has been also found that the above-prepared sheet-form piezoelectric device has a strong electrode bonding structure owing to integration of the electrode and the piezoelectric material, can have an appropriate degree of rigidity and has a durability against a mechanical external force which durability is much more excellent than that of a conventional polymer-type piezoelectric device. Further, it has been also found that the perforated sheet electrode is rich in deformability and retains the integrated strong electrode bonding structure even when the sheet-form piezoelectric device is wound into a tube. Thus, the sheet-form piezoelectric device is optimally used for providing a tubular or curved piezoelectric device also in view of its appropriate degree of rigidity.

Thus, according to the present invention, there is provided a piezoelectric device, comprising: a polymeric piezoelectric material and a perforated sheet electrode embedded within the piezoelectric material. In a preferred embodiment, the perforated sheet electrode takes the form of a mesh electrode.

In the piezoelectric device, a perforated sheet electrode is embedded within the interior and/or the surface layer of a polymeric piezoelectric material. As a result, a part of the polymeric material penetrates into the perforations of the electrode to provide a piezoelectric device having an integral structure of the electrode and the piezoelectric material and thus having an excellent electrode peel strength. Further, the perforated sheet electrode has an excellent flexibility so that it provides a piezoelectric device with a relatively small decrease in flexibility.

According to another aspect of the present invention, there is provided a tubular piezoelectric device, comprising: a sheet-form piezoelectric device formed by embedding a perforated sheet electrode at a surface layer of a polymer piezoelectric film or sheet, and wound around a certain central axis into a tube.

According to still another aspect of the present invention, there is provided a curved piezoelectric device, comprising: a sheet-form piezoelectric device formed by embedding a perforated sheet electrode at a surface layer of a polymer piezoelectric film or sheet, and formed into a curved shape with respect to a certain central axis.

According to a further aspect of the present invention, there is provided a process for producing a piezoelectric device, comprising: treating a surface of a polymer piezoelectric film or sheet with a solvent, disposing a perforated sheet electrode on the treated surface, and then pressing the perforated sheet electrode and the polymer piezoelectric film or sheet to each other for bonding.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred examples of the polymeric piezoelectric material used in the present invention may include vinylidene cyanide-vinyl acetate copolymer having a relatively high heat-resistance and vinylidene fluoride resin-based piezoelectric materials having excellent piezoelectric characteristics. Particularly, compared with vinylidene fluoride (VDF) homopolymer requiring a uniaxial stretching treatment for β-form crystallization exhibiting piezoelectricity, it is preferred to use VDF copolymers (e.g., copolymers of a major amount of VDF and a minor amount of trifluoroethylene (TrFE) or tetrafluoroethylene (TFE)) capable of β-form crystallization under ordinary crystallization conditions. The most preferred example is a copolymer of a major amount (particularly, 70-80 mol. %) of VDF and a minor amount (particularly 30-20 mol. %) of TrFE. Such a polymeric piezoelectric material may be formed into a film, e.g., by melt-extrusion, followed by uniaxial stretching or heat treatment below the softening temperature as desired, and polarization according to electric field application below the softening temperature, to provide a polymer piezoelectric film.

Figure 1:
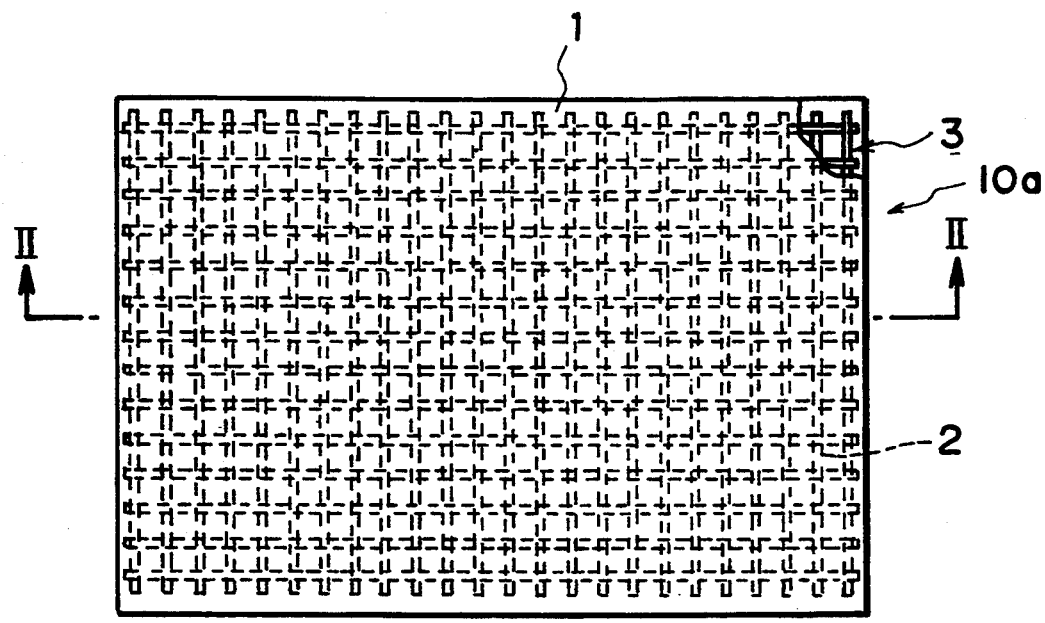
FIG. 1 is a plan view of a piezoelectric device according to an embodiment of the invention.
Figure 2:
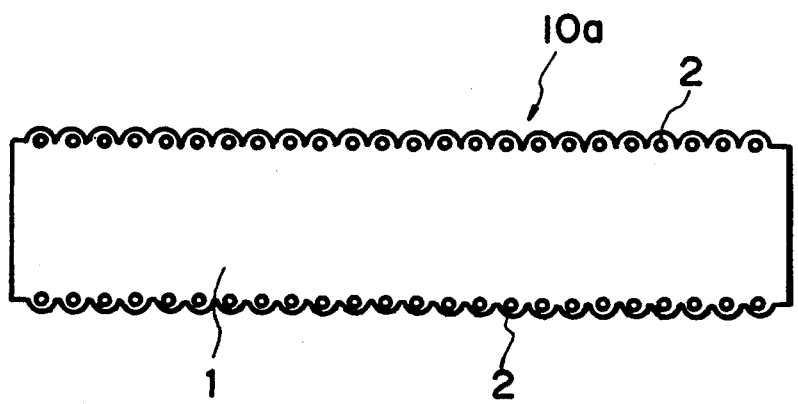
FIG. 2 is a sectional view taken along the line II—II in FIG. 1.

FIG. 1 is a plan view of a preferred embodiment of the piezoelectric device according to the present invention, and FIG. 2 is a sectional view taken along the line II—II as viewed in the directions of arrows in FIG. 1. Referring to FIGS. 1 and 2, a piezoelectric device 10a has a structure obtained by embedding a mesh-form perforated sheet electrode 2 at both surface layers of a polymer piezoelectric film 1 as described above and exposing a part 3 thereof for connection with a lead wire or a terminal.

The perforated sheet electrode used in the present invention may comprise, e.g., a metal, such as copper, stainless steel, aluminum, steel, tin, zinc, gold, silver, titanium or platinum, or another arbitrary electroconductive material having an appropriate degree of rigidity, such as carbon fiber. It is particularly preferred that the perforated sheet electrode comprises a high strength metal, such as stainless steel or titanium, or a flexible and highly extensible metal, such as phosphorus bronze.

The mesh-form perforated sheet electrode 2 may be formed by an arbitrary weave, such as twill weave, satin weave, plain dutch weave or twilled dutch weave in addition to the plain weave shown in FIG. 1. The nominal mesh thereof may preferably be within the range of from 40 mesh (e.g., plain-wove wire net having an opening of 350 μm and a wire diameter of 290 μm) to 1000 mesh (e.g., twilled dutch wove wire net having a filtrable particle size of about 25 μm and wire diameters of 80 μm (lateral)/55 μm (longitudinal)), particularly from 60 mesh (e.g., plain wove wire net having an opening of 240 μm and a wire diameter of 180 μm) to 635 mesh (e.g., twill wove wire net having an opening of 20 μm and a wire diameter of 20 μm). Accordingly, the mesh-form perforated sheet electrode 2 may preferably have a perforation (opening size or size of filtrable particles) of 20-350 μm and a wire diameter of 20-300 μm. It is preferred to use a wire net of a high strength metal, such as stainless steel or titanium. A wire net exceeding 1000 mesh has too small perforations thus being liable to result in a lowered electrode peel strength as described hereinafter, and a wire net below 40 mesh causes a lowering in hydrostatic piezoelectric constant $d_h$ which is a principal parameter determining a piezoelectric performance. Even in this case, however, a lower $d_h$ constant is accompanied with a lowering in dielectric constant $\epsilon$ similarly, the hydrostatic piezoelectric constant $g_h$ denoted by a ratio of the $d_h$ constant to the dielectric constant $\epsilon$ can be retained at a similar level.

Figure 3:
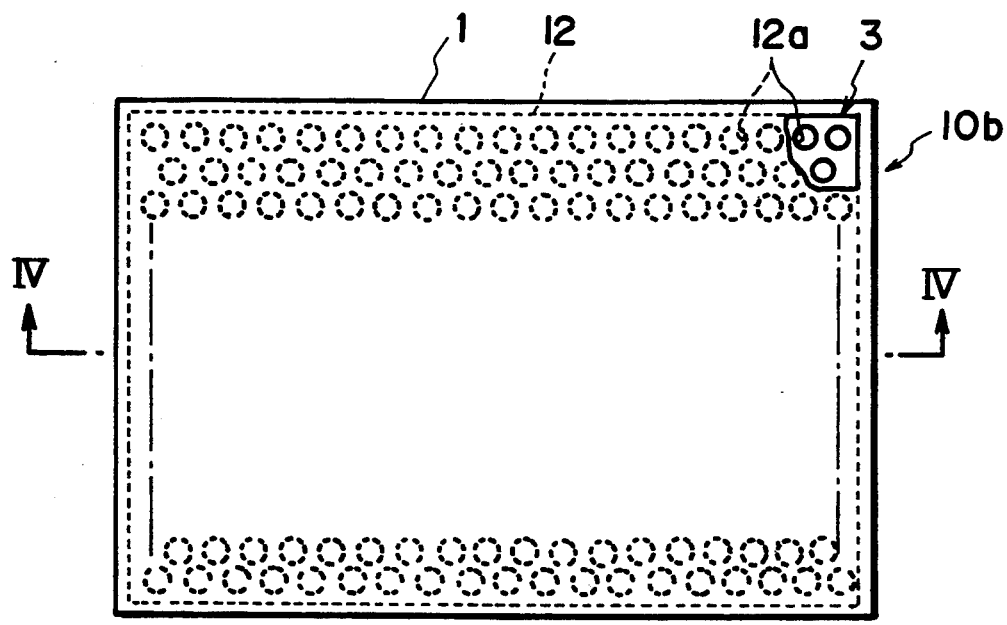
FIG. 3 is a plan view of a piezoelectric device according to another embodiment of the invention.
Figure 4:
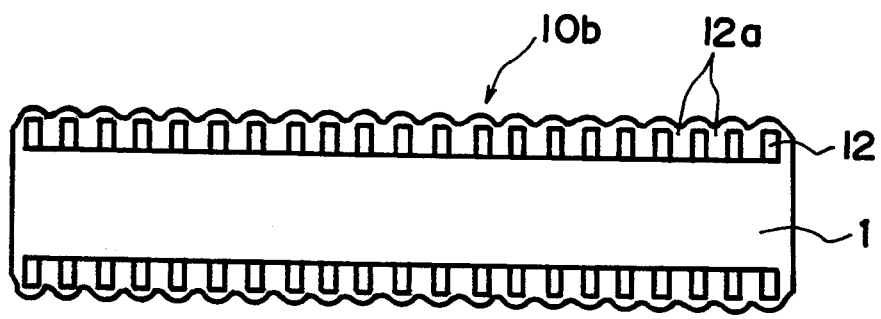
FIG. 4 is a sectional view taken along the line IV—IV in FIG. 3.

FIG. 3 is a plan view of another preferred embodiment of the piezoelectric device according to the present invention, and FIG. 4 is a sectional view taken along the line IV—IV as viewed in the direction of arrows in FIG. 3. Referring to FIGS. 3 and 4, a piezoelectric device 10b has a structure obtained by embedding a perforated sheet electrode 12 in the form of a perforated or bored plate having a large number of perforations 12a. The piezoelectric device 10b has a structure essentially identical to that of the piezoelectric device 10a shown in FIGS. 1 and 2 except for the use of the perforated plate electrode 12 provided with perforations 12a instead of the mesh-form perforated sheet electrode 2.

The perforated plate electrode 12 may be composed of similar materials as the mesh electrode 2. The diameter of a perforation 12a and distance between perforations may be determined corresponding to the opening and wire diameter, respectively, of the mesh electrode 2. It is possible to adopt a more free setting of distance between perforations, but the areal opening rate of the perforated plate electrode 12 (i.e., of perforations 12a) may preferably be set within the range of 10-70%, particularly 20-60%. If the opening rate is below 10%, the resultant electrode peel strength is lowered and, in excess of 70%, the $d_h$ constant is lowered.

The thickness of the perforated sheet electrode 2 or 12 (corresponding to the wire diameter of the mesh electrode 2 in plain weave or twill weave) may preferably be within the range of 10-800 μm, particularly 20-300 μm. If the electrode thickness is below 10 μm, the resultant piezoelectric device may not have a sufficient rigidity and, when the perforated sheet electrode is placed and press-bonded to the polymer piezoelectric film swollen by surface-treatment with a good solvent, the piezoelectric device is liable to be wrinkled. On the other hand, in excess of 800 μm, it become difficult to embed the perforated sheet electrode at the surface of the polymer piezoelectric film to an extent sufficient to provide an appropriate electrode peel strength.

Figure 5:
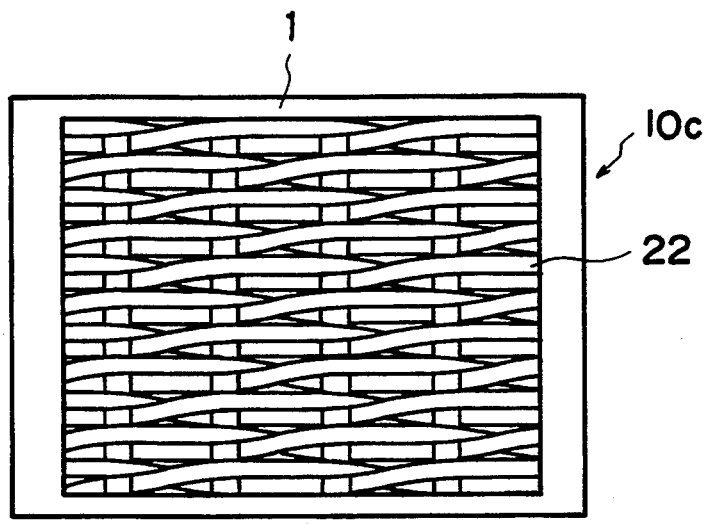
FIG. 5 is a plan view of a piezoelectric device according to another embodiment of the invention.
Figure 6:
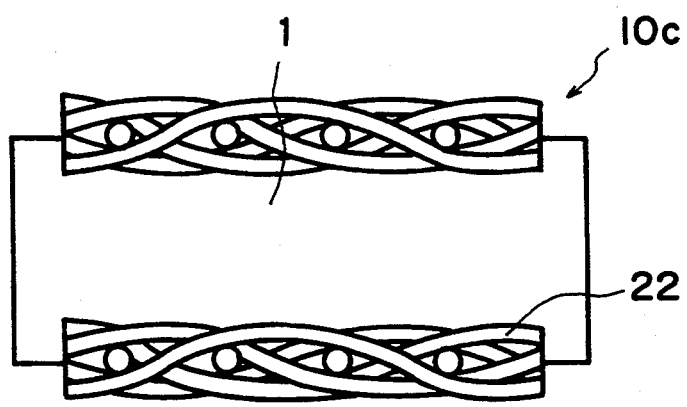
FIG. 6 is a side view of the piezoelectric device shown in FIG. 5.

The embedding of the perforated sheet electrode 2 or 12 at the surface layer of the polymer piezoelectric film should be performed in a degree sufficient to develop an anchoring effect providing a required electrode peel strength. This generally means that at least 30%, particularly at least 50%, of the thickness of the electrode should be embedded within the surface layer of the polymer piezoelectric film 1. FIG. 5 is a plan view of still another preferred embodiment of the piezoelectric device according to the present invention, and FIG. 6 is a side view thereof. Referring to the figures, the piezoelectric device 10c has a structure wherein a twilled dutch weave mesh electrode 22 is embedded up to 50% of the thickness thereof to both surface layers of a polymer piezoelectric film 1. Even in the case of such partial embedding, a substantial increase in electrode peel strength can be accomplished because of an anchoring effect of the polymeric piezoelectric material partially penetrating into the perforations of the perforated sheet electrode. It is possible to effect 100%-embedding, i.e., complete embedding. In this case, the electrode is covered with a resin constituting the polymeric piezoelectric material. In such a case, a part of the surface coating resin layer may preferably be wiped out to expose the electrode, so as to allow a connection of a lead wire or terminal to the device. Herein, the term "surface layer of a polymer piezoelectric film" means a surface portion from the surface up to a depth comparable to the thickness of the perforated sheet electrode.

The polymer piezoelectric film 1 may preferably have a thickness of about 50-2000 $\mu$m, particularly 200-1000 $\mu$m. If the film thickness is below 50 $\mu$m, it is difficult to embed the perforated sheet electrode but is liable to cause problems, such as deformation of the film and fluctuation in piezoelectric performance. In excess of 2000 $\mu$m, the flexibility of the film is impaired and the polarization becomes difficult because a high voltage liable to cause peripheral discharge is required for the polarization. If the perforated sheet electrodes are embedded at the surface layers of the polymer piezoelectric film according to the present invention, the spacing between the electrodes is decreased by the embedded thicknesses of the electrodes than the thickness of the polymer piezoelectric film. Accordingly, the original thickness of the polymer piezoelectric film should preferably be selected from the above range, while taking the thicknesses of the perforated sheet electrodes and the embedded depths thereof into consideration.

The piezoelectric device (in a planar sheet form) according to the present invention has been described based on three preferred embodiments thereof with reference to FIGS. 1-6. However, various modifications are possible within the scope of the present invention. For example, it is sufficient that the perforated sheet electrode is embedded at at least one surface layer of the polymer piezoelectric film 1 and the electrode on the other side of the polymer piezoelectric film 1 may be a conventional vapor-deposited electrode, metal foil electrode or thermally sprayed electrode. Further, the perforated sheet electrode may comprise an electroconductive sheet in the form of, e.g., an unwoven cloth or felt, having pores or voids which communicate with both surfaces of the sheet and can be impregnated with the resin of the polymeric piezoelectric material swollen or dissolved with a solvent or thermally melted, instead of the mesh electrode 2 or perforated plate electrode 12 used in the above-mentioned embodiments.

Figure 7:
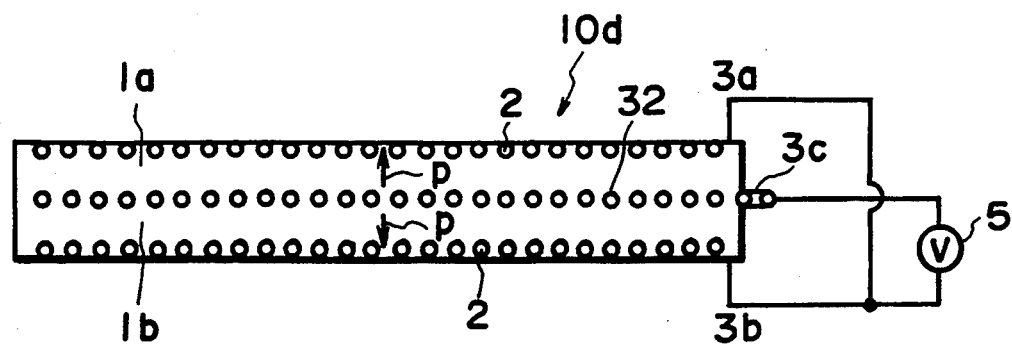
FIGS. 7 and 8 are respectively a sectional view of a piezoelectric device in laminated form according to an embodiment of the invention.

Further, as illustrated in FIG. 7 corresponding to FIG. 2, the piezoelectric device may be constituted as a laminate piezoelectric device 10d wherein a perforated sheet electrode 32 similar to the perforated sheet electrode 2 is sandwiched by and embedded at one surface layer each of a pair of polymer piezoelectric films 1a and 1b which have been provided with embedded perforated sheet electrodes 2 on the other surfaces so as to form the laminate piezoelectric device 10d as a whole. In this way, the perforated sheet electrode can be embedded not only at the surface layer of the piezoelectric device but also at the interior of the piezoelectric device. In the piezoelectric device 10d, the intermediate electrode 32 may be provided with a projection 3c for connection with a lead wire or terminal like other connecting parts 3a and 3b. When the laminate piezoelectric device 10d is used as a wave-receiving element for a hydrophone, etc., it is preferred to laminate the two polymer piezoelectric films 1a and 1b so as to have mutually opposite polarization directions p and be connected as shown in FIG. 7, thereby allowing to read the output by a voltage meter 5. As a result of the disposition due to, for example, movement of the towing means and flexural stress mentioned above, even if the piezoelectric device 10d is mechanically deformed, the deformation outputs from the piezoelectric films 1a and 1b cancel each other to prevent the occurrence of deformation noise. It is also possible to increase the number of alternate laminations of the piezoelectric films and the electrodes as desired.

Figure 8:
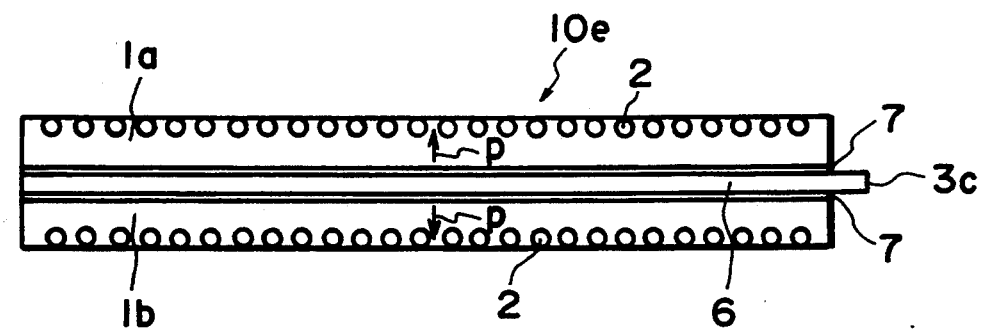

An effect similar to that obtained by the laminated piezoelectric device 10d shown in FIG. 7 may be obtained also by a laminated piezoelectric device 10e shown in FIG. 8. More specifically, the piezoelectric device 10e may be obtained by providing a pair of polymer piezoelectric films 1a and 1b each having a perforates sheet electrode 2 embedded at one surface layer thereof, and applying the polymer piezoelectric films 1a and 1b onto both surfaces of a foil electrode 6 of, e.g., copper, via adhesives 7 so that the films 1a and 1b have mutually opposite directions of polarization p. In the laminated piezoelectric device 10e, the foil electrode 6 is disposed at the deformation center (substantially no elongation or contraction stress is exerted at the time of deformation) so that the laminate piezoelectric device 10e can have a flexibility or deformability similar to that of the laminated piezoelectric device 10d shown in FIG. 7. It is also possible to use a thermally sprayed electrode instead of the foil electrode 6.

Next, the process for producing a piezoelectric device as described above according to the invention will be described. Referring to FIGS. 1 and 2 for example, a surface expected to embed a perforated sheet electrode 2 therein of a polymer piezoelectric film 1 is treated with a solvent. The solvent may suitably be a good solvent for the polymeric piezoelectric material constituting the polymer piezoelectric film 1 but can sufficiently be a solvent which has a solvency capable of swelling (even if not dissolving) the polymeric piezoelectric material. Examples of such a solvent may include: ketones, such as acetone and methyl ethyl ketone, tetrahydrofuran (THF), N,N-dimethylacetamide, and dimethylformamide. The solvent treatment may be performed by applying a solvent onto the surface of the polymer piezoelectric film 1 by coating, spraying or dipping and allowing the solvent and the film to contact each other for a period of, e.g., 2 sec to 1 hour at room temperature to 90° C. The treating conditions, such as temperature and time, can vary depending on factors, such as the composition of the polymeric piezoelectric material, the kind of the solvent, and the thickness and the shape of the electrodes. As the resultant electrode peel strength is increased if the pressure-bonding as the subsequent step is performed at a higher temperature, it is also preferred to use a solvent having a rather weak dissolving power to treat the polymer piezoelectric film at a relatively high temperature within a durable temperature range of the piezoelectric material in the solvent treatment step.

Then, on the solvent-treated surface of the polymer piezoelectric film 1, a perforated sheet electrode 2 is placed, and they are pressed against each other for bonding. It is also preferred to apply a pre-treatment to the surface contacting the polymer piezoelectric film 1 of the perforated sheet electrode 2, such as a surface treatment for enhancing the bonding with the polymeric piezoelectric material or a coating for electrode protection. An example of such pretreatment may be coating with a resin which is analogous to or having a good compatibility with the polymeric piezoelectric material.

It is preferred to effect the pressure-bonding step immediately after the solvent treatment step. It is also preferable to remove or decrease the solvent on the surface of the polymer piezoelectric film 1 by wiping or falling down.

A higher temperature in the pressure bonding step tends to increase the resultant electrode peel strength and is preferred in this respect. The temperature is generally in the range of room temperature to the heat durable temperature of the piezoelectric material and may preferably be 50°-90° C. from a practical standpoint. The pressure for the pressure bonding may be within the range of 1 kg-f/cm$^2$ to about 700 kg-f/cm$^2$ at which a polymeric piezoelectric material can cause plastic deformation and may practically preferably be 5-100 kg-f/cm$^2$. The time for the pressing may be, e.g., about 10 sec to 1 hour.

In order to obtain a laminate piezoelectric device 10d as shown in FIG. 7 having a perforated sheet electrode 32 as an intermediate electrode with a good piezoelectric performance and a sufficiently large electrode peel strength while avoiding the occurrence of voids in the neighborhood of the intermediate electrode 32, it is desired to apply appropriate pressure bonding and solvent treatment conditions so that the solvent-treated surface resin of the piezoelectric material penetrates into the perforations of the electrode and the solvent is evacuated. Such conditions may be easily found if the piezoelectric device is small in either longitudinal or lateral size. It is also preferable to use a roller for the pressure bonding to suppress the void formation.

The polarization of the polymer piezoelectric film can be performed after the electrode formation, but it may also be preferably performed to form such an electrode onto the polymer piezoelectric film after the polarization.

As another method of preparing a piezoelectric device according to the present invention, it is also possible to hold a perforated sheet electrode by use of a fixing member within a mold and casting therein a piezoelectric resin material in a heat-melted state or in solution. In this case, however, the polarization of the polymeric piezoelectric material is performed after the electrode formation.

With respect to the piezoelectric devices 10a, 10b, 10d and 10e thus formed, a part of the surface resin layer coating the perforated sheet electrode 2, 12 or 32 is removed by a solvent to expose the electrode to form a part 3 for connection with a lead wire or a terminal.

The thus-formed piezoelectric device in a sheet-form according to the present invention is provided with an improved electrode peel strength compared with a conventional polymer-type piezoelectric device, while retaining excellent impact-resistance and flexibility not attainable by a ceramic-type piezoelectric device. Accordingly, the piezoelectric device according to the present invention can be used similarly as the conventional piezoelectric device and may suitably be applied to a use wherein a larger stress is applied to the piezoelectric device.

Figure 9:
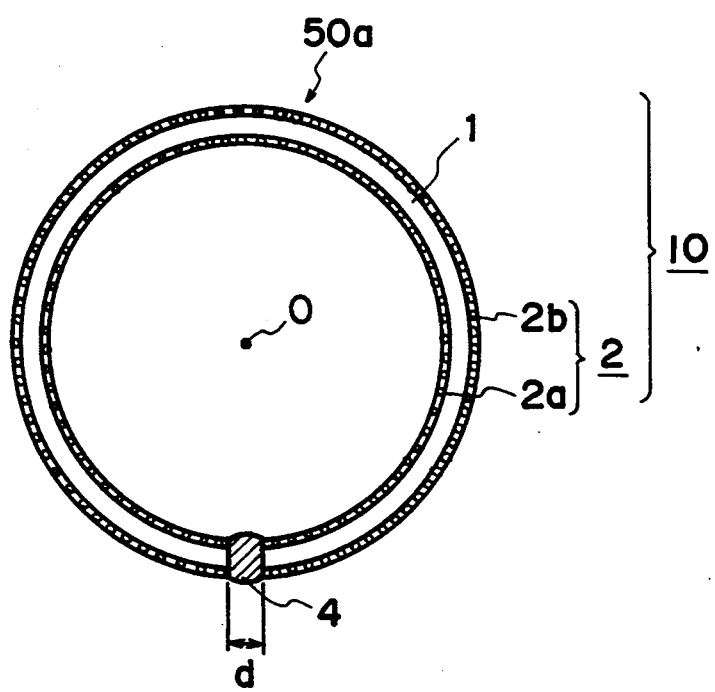
FIG. 9 is a radial sectional view of an embodiment of the tubular piezoelectric device according to the invention.

FIG. 9 is a view showing a radial section of a tubular piezoelectric device 50a according to an embodiment of the present invention. The tubular piezoelectric device 50a has a structure obtained by winding a sheet-form piezoelectric device 10 comprising perforated sheet electrodes 2 (2a and 2b) embedded at both surface layers of a polymer piezoelectric film 1 around an imaginary central axis O to form a roughly tubular structure and then joining abutting ends thereof with, e.g., an epoxy adhesive 4 so as to fill a spacing d. The sheet-form piezoelectric device 10 may for example have a planar structure and a sectional structure before the winding thereof identical to those of the piezoelectric device 10a shown in FIGS. 1 and 2, respectively.

Figure 10:
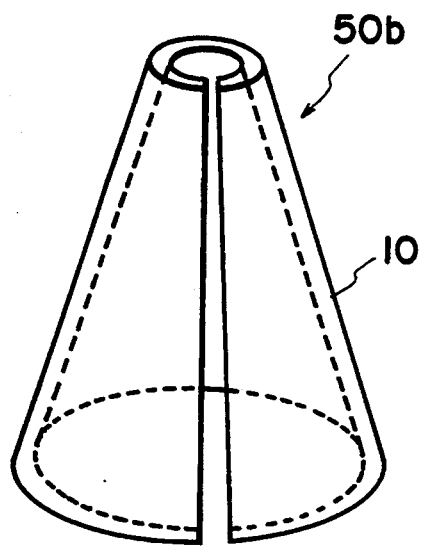
FIG. 10 is a perspective view of another embodiment of the tubular piezoelectric device according to the invention.

The tubular or curved piezoelectric device according to the present invention may have various radial sectional shapes (i.e., shapes of sections perpendicular to the central axis O), such as an oval, a circular arc, an oval arc, a polygon, a vortex, a petal shape, an unclosed curve or partial polygon (sectional shapes of a curved piezoelectric device having plural centers of curvature), or a zigzag shape including a folded part. It is however preferred that the curve, corner or edge formed by the winding or folding will not provide a minimum radius of curvature below 1 mm. The cross-sectional shape of a longitudinal section including the central axis of the tubular piezoelectric device may for example be a square, a rectangle, a trapezoid, or a triangle (providing a tubular piezoelectric device 50b having a conical shape as an entire shape as shown in FIG. 10).

It is not necessary that both the electrodes 2a and 2b constituting the tubular piezoelectric device are perforated sheet electrodes. For example, a tubular piezoelectric device may be formed by winding a sheet-form piezoelectric device having only a perforated sheet electrode corresponding to the inner electrode 2a to form a tubular structure and then forming an outer electrode 2a by application of a foil electrode, thermal spraying or vapor deposition. However, it is particularly preferred that the electrode provided to the sheet-form piezoelectric device before the winding is a perforated sheet electrode.

The sheet-form piezoelectric device 10e having an inner foil electrode 6 shown in FIG. 8 can also be easily wound into a tubular shape similarly as the sheet-form piezoelectric device 10d shown in FIG. 7 because the foil electrode 6 is disposed to form a neutral plane substantially free from stress accompanying elongation or contraction.

Figure 11:
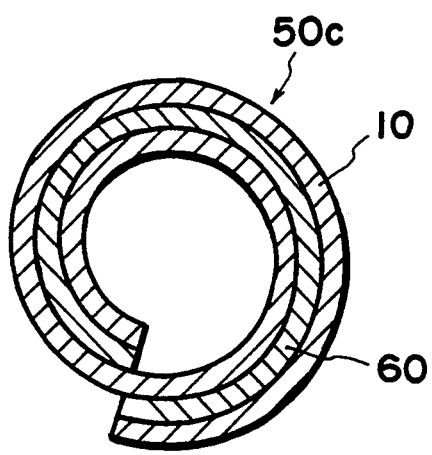
FIG. 11 is a radial sectional view of an embodiment of the tubular piezoelectric device in a superposed layer structure according to the invention.

The tubular piezoelectric device may also be formed by winding a sheet-form piezoelectric device in plural turns. In this case, however, it is preferred to wind the sheet-form piezoelectric device so as to leave a certain spacing, thereby avoiding electrical contact between the inner mid outer electrodes or, e.g., as shown in FIG. 11, to wind a sheet-form piezoelectric device 10 provided with an insulating coating 60 on at least one side thereof to form a tubular piezoelectric device 50c with a multi-layer superposed structure. Such a multi-layer superposed tubular piezoelectric device can have a large wave-transmitting and/or -receiving area per unit volume, thereby to provide the device with a lower impedance.

Figure 12:
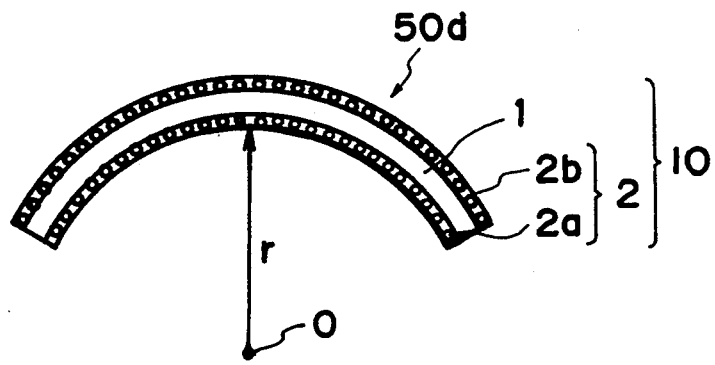
FIG. 12 is a radial sectional view of an embodiment of the curved piezoelectric device according to the invention.

On the other hand, the piezoelectric device according to the present invention may also be embodied as a curved piezoelectric device 50d as shown in FIG. 12 by winding a sheet-form piezoelectric device 10 partially around a certain central axis O (which can be present in a plurality). Such a curved piezoelectric device can be obtained because a sheet-form piezoelectric device 10 in the present invention has an appropriate degree of rigidity and also a plasticity or a shape-retaining property allowing the maintenance of the resultant curved shape. Such a curved piezoelectric device is particularly suitable when a curved shape is preferred in view of wave-transmitting and/or -receiving performances or the shape of a surface on which the device is disposed. The curved piezoelectric device according to the present invention may have a sectional shape of not only a uniform curve as shown in FIG. 12 but also a shape partially including a curve appearing at a corner or a folding point (edge), such as a non-closed polygon, or a zigzag shape. Herein, the curvature radius means a distance $\gamma$ as shown in FIG. 12 between the curvature center O and a point opposing the center O on the inner surface of the device.

In order to wind or curve a sheet-form piezoelectric device into a desired shape, it is preferred to obtain an appropriate size of sheet-form piezoelectric device and shape the sheet-form piezoelectric device into an almost desired shape by using an appropriate shape of mold (female mold) and/or core, followed by a relaxation heat-treatment, e.g., at a temperature of 50°–90° C. for 30 min. to 24 hours to thermally fix the desired shape.

The thus-obtained tubular or curved piezoelectric device according to the present invention may suitably be used not only for a hydrophone or microphone but also for various wave-transmitting and/or -receiving devices, because of the isotropic character of wave-transmitting/receiving performance or wave-transmitting/receiving characteristic suitably modified by a desired curved shape.

[EXAMPLES]

Hereinbelow, the present invention will be described in further detail based on Examples and Comparative Examples. Piezoelectric devices produced in the Examples were evaluated with respect to the following items.

[Piezoelectric performances]

Hydrostatic piezoelectric constants ($d_h$ constant and $g_h$ constant) were measured in the following manner.

$d_h$ constant: A sample device was dipped in silicone oil contained in a pressure vessel, and the vessel was pressurized under a continuously increasing pressure P (Newton (N)/m$^2$) from a nitrogen gas supply to measure a charge Q (Coulomb (C)) generated in the device. Then a charge increment dQ corresponding to a pressure increment dP was measured in the neighborhood of a gauge pressure of 2 kg-f/cm$^2$ and the $d_h$ constant was calculated by the following equation:

$$d_h = (dQ/dP)/A,$$

wherein A denotes the electrode area (m$^2$), and $d_h$ constant was obtained in the unit of C/N.

$g_h$ constant: The dielectric constant $\epsilon$ of the polymer piezoelectric film constituting the sample device was measured by a multi-frequency LCR meter (available from Yokogawa Hewlett Packard K.K.). The $g_h$ constant was calculated by the following equation and obtained in the unit of volt (V)$\times$m/N:

$$g_h = d_h/\epsilon.$$

[Flexibility]

A sample device was supported at two fulcrums 4 cm distant from each other, and an increasing load was applied to the device at a mid point between the fulcrums at a rate of 5 mm/min by using a testing machine ("STROGRAPH-R2", mfd. by K.K. Toyo Seiki Seisakusho), whereby a load W required for causing a 2 mm deflection of the sample was measured and divided by the sample width (2 cm) to obtain a deflecting load (g/cm) as an indication of the flexibility.

[Electrode peel strength]

An epoxy-based adhesive ("Araldite AW106" (resin): "HV953U" (hardener)=1:1, available from Nippon Ciba-Geigy K.K.) was applied on a 35 $\mu$m-thick copper foil, and a sample piezoelectric device of which the electrode-forming surface was lightly wiped with acetone to remove the surface coating resin layer was laminated so that the electrode contacted the adhesive on the copper foil. Then, the laminate was pressed at a load of 100 kg-f/cm$^2$ at 90° C. for 20 min. Then, the laminate sample was subjected to a 90 degree-peeling test at a rate of 50 mm/min according to JIS C-6481 by using a testing machine ("STROGRAPH-R2", mfd. by K.K. Toyo Seiki Seisakusho). The electrode peel strength is empirically known to show a good correspondence with solderability for lead wire connection, i.e., freeness from difficulties such as cracking or peeling occurring at soldered part at the time of soldering the lead wire to the electrode or during handling of the device after the soldering.

Example 1

A piezoelectric device of the structure shown in FIGS. 1 and 2 was prepared in the following manner.

A VDF/TrFE (75/25 mol ratio) copolymer (mfd. by Kureha Kagaku Kogyo K.K.) was extruded at a die temperature of 265° C. into a sheet, which was then subjected to heat treatment at 125° C. for 13 hours and a polarization treatment under an electric field of 65 V/$\mu$m for a total of 1 hour including a hold time of 5 min. at 123° C. and the accompanying temperature-raising and -lowering time. As a result, a 500 $\mu$m-thick polymer piezoelectric film 1 was obtained. The film showed a flexibility (deflecting load) of 47 g-f/cm.

The polymer piezoelectric film was dipped in acetone at 30° C. for 30 sec., and then both surfaces thereof were sandwiched by a pair of wire nets of stainless steel (SUS 316) in 500 mesh (twill weave, opening size: 26 $\mu$m, wire diameter: 25 $\mu$m). The laminate was then held for 2 min. at a temperature of 90° C. and a pressure of 50 kg-f/cm$^2$ for pressure bonding to obtain a piezoelectric device of the structure shown in FIGS. 1 and 2.

Example 2

A piezoelectric device was prepared in the same manner as in Example 1 except that the wire nets were dipped in a 7.5% solution of the VDF/TrFE (75/25 mol ratio) copolymer in THF and dried to form a resin coating, and the thus resin-coated wire nets were used.

Comparative Example 1

Both surfaces of the polymer piezoelectric film obtained in Example 1 were roughened by sand blasting with alumina abrasive (particle size: #220) at an air pressure of 4.0 kg-f/cm² and a distance of 15 cm and coated with a 10–20% solution in 1,2-dichloroethane (solvent) of an SBR-based adhesive ("4693 Scotch Grip", mfd. by Sumitomo 3M K.K.). Then, the both surfaces were sandwiched between the wire nets used in Example 1, followed by preheating at 90° C. for 4 min. and pressure-bonding at 90° C. and 150 kg-f/cm² for 4 min., to obtain a piezoelectric device.

Comparative Example 2

Onto both surfaces of the polymer piezoelectric film obtained by surface-roughening and adhesive application in the same manner as in Comparative Example 1, 35 μm-thick copper foils were applied to obtain a piezoelectric device.

Comparative Example 3

Both surfaces of the polymer piezoelectric film obtained by surface-roughening in the same manner as in Comparative Example 1 were respectively coated with an about 40 μm-thick sprayed electrode by thermal spraying of zinc by using an electric wire-melting sprayer ("DK-Type Metal Sprayer Model-E", mfd. by Kato Metallicon K.K.) under the conditions of an air pressure of 5 kg-f/cm² and a voltage of 15 volts to obtain a piezoelectric device.

The piezoelectric devices thus obtained were evaluated with respect to the respective items, and the results thereof are summarized in the following Table 1.

TABLE 1

| | Prod. conditions | | | | |
|---|---|---|---|---|---|
| | Wire net mesh | Press-bonding temp. (°C.) | $d_h$ constant (pC/N) | Peel strength (kg-f/cm) | Deflecting load (g-f/cm) |
| Ex. 1 | 500 | 90 | 11.3 | 4.3 | 82 |
| Ex. 2 | 500 | 90 | 11.6 | 2.8 | 86 |
| Comp. Ex. 1 | 500 | 90 | 11.6 | 1.1 | 90 |
| Comp. Ex. 2 | — | — | 12.1 | 1.9 | 700 |
| Comp. Ex. 3 | — | — | 11.2 | 0.8 | 92 |

[Remarks to Table 1]
Example 1: Wire net embedded.
Example 2: Resin-coated wire net embedded.
Comp. Ex. 1: Wire net adhered with SBR.
Comp. Ex. 2: Cu foil adhered with SBR.
Comp. Ex. 3: Zn sprayed.

Example 3

Piezoelectric devices were obtained in the same manner as in Example 1 except that the pressure-bonding temperature was charged to room temperature, 50° C. and 70° C.

Figure 14:
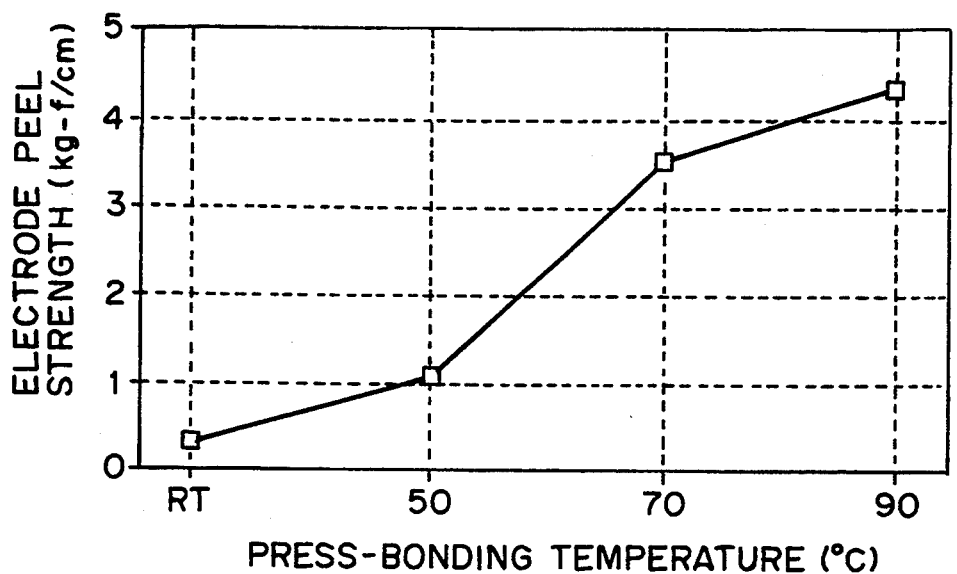
FIG. 14 is a graph showing experimental data of electrode peel strengths depending on pressure-bonding temperature of piezoelectric devices according to the invention.
Figure 15:
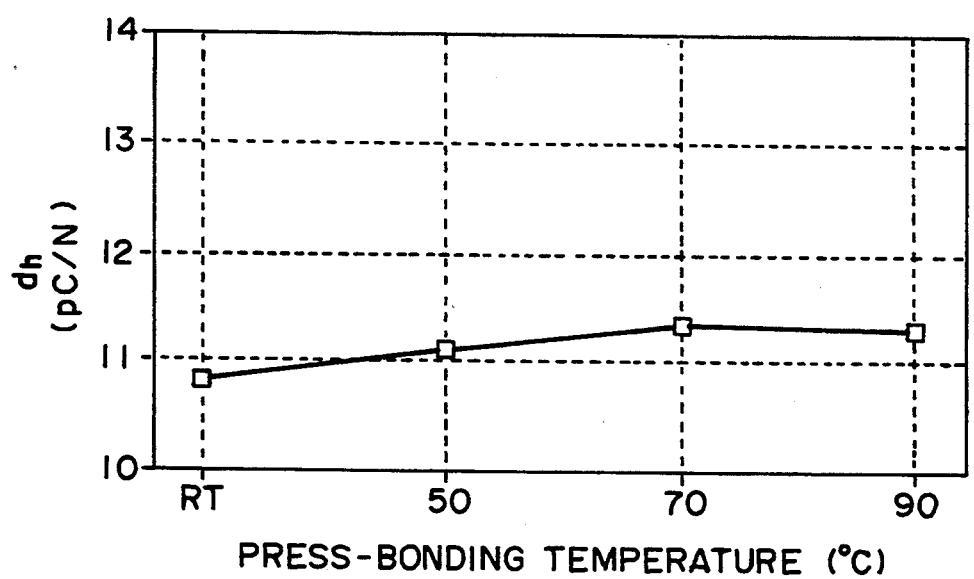
FIG. 15 is a graph showing experimental data of $d_h$ constants depending on pressure-bonding temperature of piezoelectric devices according to the invention.

The electrode peel strengths and the $d_h$ constants of the thus-obtained devices were measured, and the results are inclusively shown in FIGS. 14 and 15 and Table 3 appearing hereinafter.

Example 4

Piezoelectric devices were prepared in the same manner as in Example 1 except that the wire net was replaced by those shown in Table 2 below of 40–800 mesh, and the pressure bonding temperature was changed to 50° C.

TABLE 2

| Mesh | Weave | Opening (μm) | Wire dia. (=thickness) (μm) | Opening rate (%) |
|---|---|---|---|---|
| 40 | plain | 350 | 290 | 29.5 |
| 100 | plain | 140 | 110 | 31.2 |
| 200 | plain | 77 | 50 | 36.8 |
| 300 | twill | 45 | 40 | 27.8 |
| 400 | twill | 34 | 30 | 27.8 |
| 500 | twill | 26 | 25 | 25.8 |
| 800[*1] | twilled dutch | ca. 40[*2] | 77/100[*3] | — |

[*1]Lateral mesh. Longitudinally 80 mesh.
[*2]Expressed as filterable particle size.
[*3]Lateral wire diameter/longitudinal wire diameter.

Figure 16:
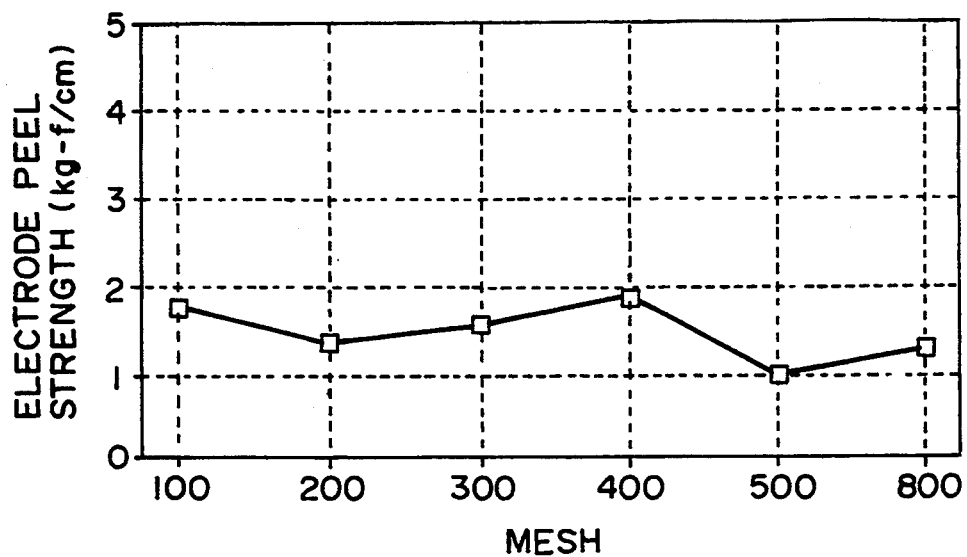
FIG. 16 is a graph showing experimental data of electrode peel strengths depending on mesh numbers of metal nets of piezoelectric devices according to the invention.
Figure 17:
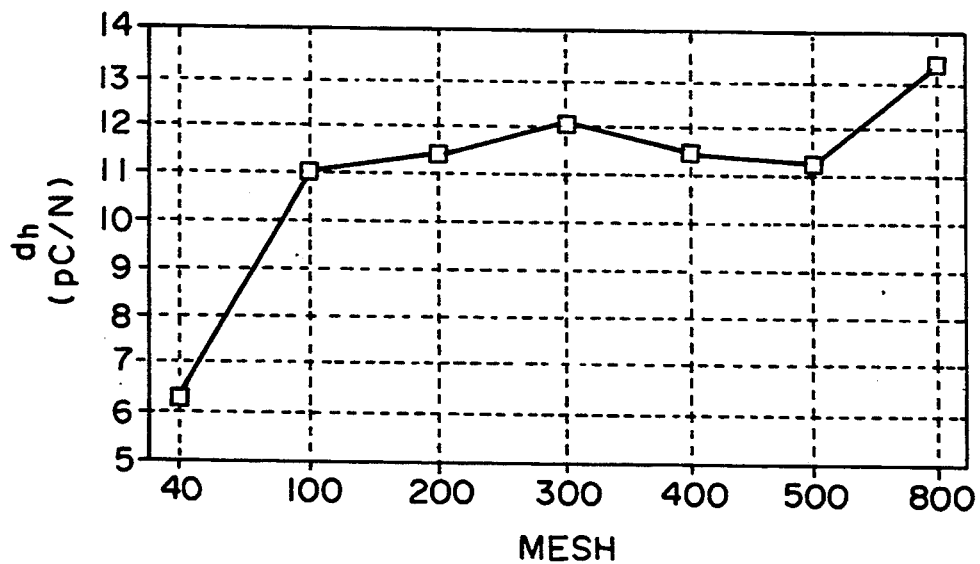
FIG. 17 is a graph showing experimental data of $d_h$ constants depending on mesh numbers of metal nets of piezoelectric devices according to the invention.

The electrode peel strengths and the $d_h$ constants of the thus-obtained devices were measured, and the results are inclusively shown in FIGS. 16 and 17 and Table 3 appearing hereinafter.

TABLE 3

| Prod. conditions | | Piezoelectricity | | Electrode peel |
|---|---|---|---|---|
| Wire net mesh | Press-bonding temp. (°C.) | $d_h$ const. (pC/N) | $g_h$ const. (Vm/N) | strength (kg-f/cm) |
| 500 | room temp. | 10.8 | 0.167 | 0.4 |
| 500 | 50 | 11.1 | 0.161 | 1.1 |
| 500 | 70 | 11.3 | 0.150 | 3.6 |
| 40 | 50 | 6.5 | 0.162 | —[*1] |
| 100 | 50 | 11.0 | 0.202 | 1.8 |
| 200 | 50 | 11.4 | 0.183 | 1.3 |
| 300 | 50 | 12.0 | 0.182 | 1.5 |
| 400 | 50 | 11.5 | 0.162 | 1.9 |
| 800 | 50 | 13.3 | 0.224 | 1.3 |

[*1]The wire net was too hard to effect the 90 degree-peeling test.

As is understood from the results of the above Examples and Comparative Examples, the sheet-form piezoelectric device according to the present invention obtained by embedding a perforated sheet electrode at the surface layer of a polymer piezoelectric film retains advantageous features of conventional polymer-type piezoelectric devices and can be provided with remarkably improved mechanical strengths as represented by electrode peel strength without incurring deterioration of piezoelectric performances. Accordingly, the sheet-form piezoelectric device is not only applicable as it is to the use of the conventional polymer-type piezoelectric device but also shows excellent performances under the conditions of use wherein a severe stress is applied thereto.

Example 5

In the following manner, a laminate sheet-form piezoelectric device having a structure as shown in FIG. 8 was prepared and then used to prepare a tubular piezoelectric device.

Acetone at 30° C. was applied onto one surface of the polymer piezoelectric film obtained in Example 1 and held for 30 sec. Thereafter, a wire net of phosphorus bronze in 300 mesh (twill weave, opening size: 45 μm, wire diameter: 40 μm, opening rate: 27.8%) was placed on and pressed against the surface at a temperature of 90° C. at a pressure of 50 kg-f/cm² for 2 min., thereby to embed the wire net at the surface layer of the polymer piezoelectric film.

The thus-treated polymer piezoelectric film was cut into an appropriate size to form a pair of polymer piezoelectric films 1a and 1b each having the wire net embedded at one surface thereof (FIG. 8). The other surface of each polymer Piezoelectric film was roughened by sand-blasting with alumina abrasive (particle size: #220) at an air pressure of 4.0 kg-f/cm² and a distance of 15 cm and then coated with an SBR-based adhesive ("4693 Scotch Grip", mfd. by Sumitomo 3M K.K.) diluted to a concentration of 10-20% with 1,2-dichloroethane (solvent). Then, a 35 μm-thick copper foil 6 was sandwiched between the adhesive-coated surfaces of the pair of the polymer piezoelectric films, and the entire laminate was subjected to preheating at 90° C. for 4 min and pressure bonding at 90° C. and 150 kg-f/cm² for 4 min. Then, the laminate was cut into a size of 46 mm in width and 90 mm in length to form a laminate sheet-form piezoelectric device 10e having a sectional structure shown in FIG. 8. The two layers 1a and 1b in the laminate piezoelectric device 10e respectively showed a hydrostatic piezoelectric constant $d_h$ of 12.8 pC/N.

Figure 13:
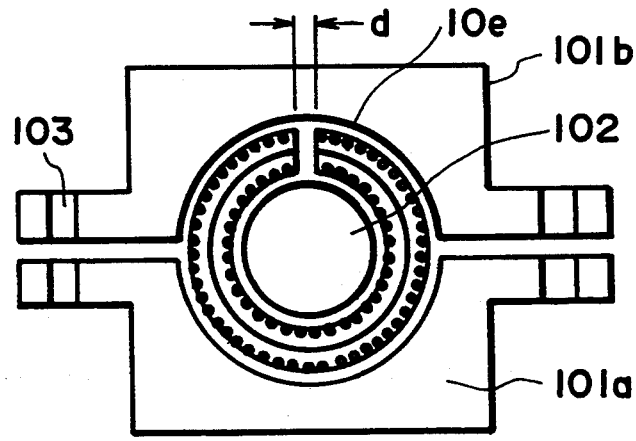
FIG. 13 is a schematic sectional view of a mold for illustrating a step of shaping a tubular piezoelectric device according to the invention.

Separately, as shown in FIG. 13, two mold halves 101a and 101b providing a cylinder of 16 mm in inner diameter in combination and a core 102 having an outer diameter of 14 mm were provided, and the above-prepared sheet-form piezoelectric device 10e was wound about the core 102 and fit in the mold half 101a, followed by coverage with the remaining mold half 10b and secure fastening of the halves 101a and 101b by bolting through bolt holes 103.

Then, the thus-set mold was placed in a drying oven at 70° C. and held for 12 hour to effect thermal fixation, thereby obtaining a roughly tubular piezoelectric device. After taking out the piezoelectric device, the remaining gap d (=1.2 mm) was filled with an epoxy adhesive ("Araldite AW106" (resin): "HV953U" (hardener)=1:1, available from Nippon Ciba-Geigy K.K.) to complete a tubular piezoelectric device.

In the tubular piezoelectric device, the inner layer 1a and the outer layer 1b showed hydrostatic piezoelectric constants $d_h$ of 11.6 pC/N and 12.4 pC/N, respectively, which had not been substantially changed from the value before the shaping into the tube.

Comparative Example 4

A sheet-form piezoelectric device corresponding to the one shown in FIG. 8 was prepared in a similar manner as in Example 5 except that, instead of embedding the wire net electrodes 2, the 35 μm-thick foil electrodes identical to the central electrode 6 were applied to the roughened surfaces of the polymer piezoelectric films by adhesive layers identical to the adhesive 7 to obtain a laminate sheet-form piezoelectric device having layer structure similar to the one shown in FIG. 8 but having copper foil electrodes as the both surface electrodes.

The laminate sheet-form piezoelectric device was tried to be shaped into a tubular piezoelectric device by 12 hours of thermal fixing at 70° C. using the same mold and core as in Example 5, whereas the outer electrode was broken and the shaping was impossible.

As described above, according to the present invention, there is provided a piezoelectric device having a tubular or curved shape capable of providing suitable wave-transmitting and -receiving performances by utilizing an appropriate degree of rigidity, shapability and shape-retaining property of a sheet-form piezoelectric device which has been obtained by embedding perforated sheet electrodes at the surface layers of a polymer piezoelectric film.

What is claimed is:
1. A sheet-form piezoelectric device, comprising:
    a polymeric piezoelectric film or sheet, and a perforated sheet electrode embedded within at least one surface layer of the piezoelectric film or sheet; wherein
    (a) said polymeric piezoelectric film or sheet has a thickness of 50-2000 μm, and
    (b) said perforated sheet electrode is
        (i) a mesh electrode having a perforation of 20-350 μm and a wire diameter of 20-300 μm, or
        (ii) a bored plate electrode having a thickness of 10-800 μm and an areal opening ratio of 10-70%.
2. The tubular piezoelectric device, comprising:
    a sheet-form piezoelectric device formed by embedding a perforated sheet electrode within a surface layer of a polymer piezoelectric film or sheet, and wound around a certain central axis into a tube, and wherein:
    (a) said polymeric piezoelectric film or sheet has a thickness of 50-2000 μm, and
    (b) said perforated sheet electrode is
        (i) a mesh electrode having a perforation of 20-350 μm and a wire diameter of 20-300 μm or
        (ii) a bored plate electrode having a thickness of 10-800 μm and an areal opening ratio of 10-70%.
3. The tubular piezoelectric device according to claim 2, wherein the sheet-form piezoelectric device is provided with an insulating coating at least one surface thereof and is wound in plural turns around the central axis into a tube with plural superposed layers of the sheet-form piezoelectric device.
4. A curved piezoelectric device, comprising:
    a sheet-form piezoelectric device formed by embedding a perforated sheet electrode within a surface layer of a polymer piezoelectric film or sheet, and formed into a curved shape with respect to a certain central axis, and wherein:
    (a) said polymeric piezoelectric film or sheet has a thickness of 50-2000 μm, and
    (b) said perforated sheet electrode is
        (i) a mesh electrode having a perforation of 20-350 μm and a wire diameter of 20-300 μm or
        (ii) a bored plate electrode having a thickness of 10-800 μm and an areal opening ratio of 10-70%.

* * * * *